AMPLIFIER USING MAGNETORESISTIVE MEDIUMS

Filed July 26, 1965 3 Sheets-Sheet 1

May 7, 1968 HAJIME ENOMOTO 3,382,449

AMPLIFIER USING MAGNETORESISTIVE MEDIUMS

Filed July 26, 1965 3 Sheets-Sheet 2

May 7, 1968 HAJIME ENOMOTO 3,382,449

AMPLIFIER USING MAGNETORESISTIVE MEDIUMS

Filed July 26, 1965 5 Sheets-Sheet 3

United States Patent Office 3,382,449

Patented May 7, 1968

3,382,449
AMPLIFIER USING MAGNETORESISTIVE MEDIUMS

Hajime Enomoto, Ichikawa-shi, Japan, assignor to Kokusai Denshin Denwa Kabushiki Kaisha, Tokyo-to, Japan, a joint-stock company of Japan Filed July 26, 1965, Ser. No. 474,567
Claims priority, application Japan, July 27, 1964, 39/42,022
24 Claims. (Cl. 330—62)

This invention relates to an amplifier using magnetoresistive mediums.

There has been heretofore proposed various kinds of amplifiers for electric signals using amplifying components such as vacuum tubes, semiconductors, and the like. These conventional amplifiers, however, have generally such disadvantages as narrow amplifying band, relatively large noise figure, etc. Accordingly, it is considerably difficult to form a wide band amplifier with high gain by means of the conventional amplifying systems.

An object of this invention is to provide a wide band amplifier for electric signals.

Another object of this invention is to provide an amplifier capable of obtaining high gain with respect to electric signals over a wide frequency band.

Still another object of this invention is to provide a unidirectional low noise amplifier.

A further object of this invention is to provide a bi-directional low noise amplifier.

Said objects of this invention have been attained by an amplifier according to this invention, comprising a plurality of magnetoresistive mediums each having a resistance variable in accordance with the magnitude of a control magnetic field applied thereto, a plurality of control means each for applying the magnetic field to a medium, two paths in each of which the mediums and the control means are alternately connected in cascade, said control means of one of said paths being respectively interlinked to the mediums of the other of the paths so that the resistance of the respective medium of said one of the paths is controlled so as to vary inversely in proportion to the magnitude of a signal passing through the same medium, from the control means of the other of the paths, at an instant when a signal passed through the control means adjacent to the medium of said one of the paths passes through the said adjacent medium of the same path, bias means for applying an appropriate D-C bias to each of the paths, input means coupled with any of the paths for applying an input signal thereto, and output means coupled with the path coupling with the input means for deriving an amplified output signal therefrom, whereby the input signal travels in the path to which it is applied and is successively amplified through the respective mediums of the same path. In the amplifier of this invention, a plurality of said paths identical to one another may be employed. It is possible to use, as said magnetoresistive mediums, magnetoresistive mediums each having a resistance which is variable proportionally to or inversely proportionally to the magnitude of the control magnetic field applied thereto, if necessary, by applying an appropriate magnetic bias to the medium reversely to the control magnetic field.

The novel features of this invention are set forth with particularity in the appended claims. This invention, however, as to its construction and operation together with further advantages thereof, may best be understood by reference to the following description, taken in connection with the accompanying drawings in which like parts are designated by like reference characters, and in which:

Figure 1:
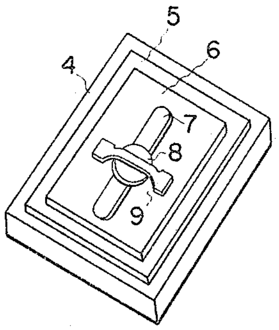
FIGS. 1, 2A, 2B and 11 show elements, circuitries, and amplifiers of this invention.
Figure 2A:
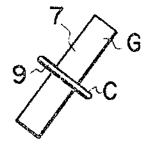
Figure 2B:
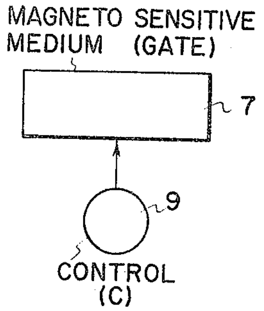
Figure 3:
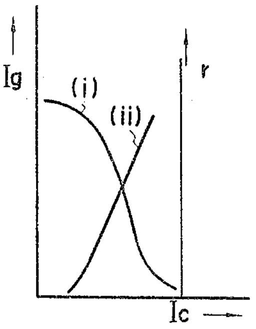
FIGS. 3 and 6 show characteristic curves for describing the operation of this invention.

Referring to FIGS. 1, 2A, 2B and 3, the operational principle of a circuitry employed in the amplifier of this invention will be first described. FIG. 1 shows a cryotron comprising a substratum 4 such as glass, a layer 5 with a relatively high critical temperature such as lead (Pb) deposited on the substratum 4, an insulation layer 6 such as silicon mono-oxide (SiO) deposited on the layer 5, a tin (Sn) strip 7 having a lower critical temperature than that of the layer 5 and deposited on the layer 6, and a small control line 9 of lead (Pb) crossing over the tin strip 7 with an insulation layer 8, such as arsenic oxide interposed therebetween. In the description hereinafter, the strip 7 is referred to as "Gate," and the line 9 is referred to as "Control." When a control current $Ic$ flows into the Control, a magnetic field is generated around the Control, so that a current $Ig$ flowing through the Gate is controlled. FIG. 3 illustrates a current $Ic$ US. current $Ig$ characteristic curve (i) and a current $Ic$ US. resistance $r$ of the Gate characteristic curve (ii). These characteristic curves indicate that the circuitry has an amplification function with respect to the current $Ic$, the amplified current being the current $Ig$. In the following description, the circuitry as shown in FIG. 1 is illustrated as in FIG. 2A or 2B for simple illustration. The Gate comprises a magnetoresistive medium as described above. Accordingly, superconductors or semiconductors each having a resistance which is variable in accordance with the magnitude of the control magnetic field applied thereto can be employed as said Gate as well as the tin strip.

Figure 4:
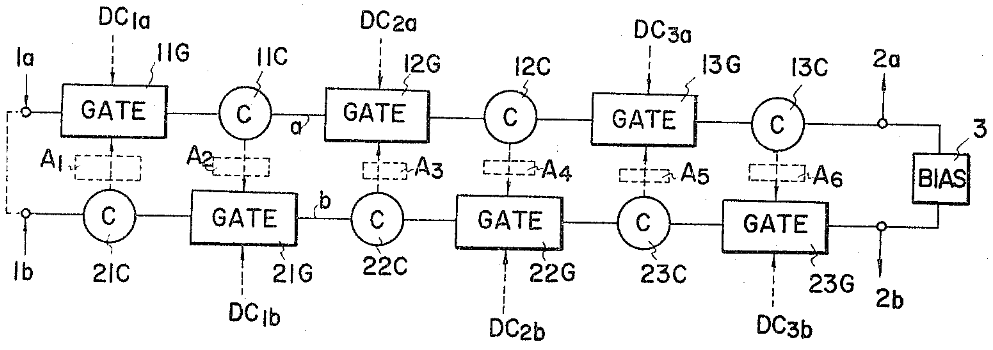
FIGS. 4, 5, 7, 8, 9 and 10 show embodiments of this invention.

FIG. 4 shows an example of this invention comprising a plurality of Gates of magnetoresistive mediums 11G, 12G, 13G, 21G, 22G and 23G, a plurality of Controls 11C, 12C, 13C, 21C, 22C and 23C, a bias means 3, input means 1*a* and 1*b* and output maens 2*a* and 2*b*. Said Gates and Controls form two paths *a* and *b* in each of which said Gates and Controls are alternately connected in cascade as shown in FIG. 4. Said Controls 11C, 12C and 13C (or 21C, 22C and 23C) of one (*a* or *b*) of two paths interlink respectively to said Gates 21G, 22G and 23G (or, 11G, 12G and 13G). A bias means 3 applies an appropriate bias to each of the paths *a* and *b*. Input means 1*a* and 1*b* are for applying an input signal to the respective path *a* or *b*, and output means 2*a* and 2*b* are for deriving an output signal amplified from the respective path *a* or *b*. The operation of this embodiment of the invention is as follows.

(1) In the case where the resistance of each Gate is proportional to the magnitude of the magnetic field applied from the respective Control:

The current $Ig$ flowing through each Gate varies as shown in FIG. 3 in accordance with the magnitude of the current $Ic$ flowing through each Control. In other words, the resistance of each Gate becomes large (or small) according to increase (or decrease) of the current $Ic$. It is assumed that the input signal applied to the path *a* passes through the same path *a* and the current $Ic$ flowing through the Control 11C has become larger in accordance with the amplitude of the applied signal passing through the path *a*. The resistance of the Gate 21G of the path *b* becomes larger according to the magnetic field produced by the current $Ic$, and then the magnitude of the current $Ig$ passing through the Gate 21G and the Control 22C, etc., becomes smaller. Accordingly, the resistance of the Gate 12G controlled by the magnetic field produced by the current $Ic$ of the Control 22C becomes smaller.

Figure 6:
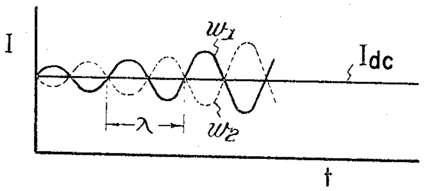

This embodiment is so constituted that the magnetic field produced by the current $Ic$ of the Control (e.g., 22C)

is applied to the corresponding Gate (e.g., 12G) at an instant when the signal passed through the Control 11C adjacent to the Gate 12G passes through the said adjacent Gate 12G. The signal passing through the Gate 12G is therefore amplified since the resistance of the Gate 12G becomes smaller than that without the control current Ic of the Control 22C. Consequently, the amplitude of the signal passing through one (*a* or *b*) of the paths becomes larger than when the amplitude of the signal passing through the other (*b* or *a*) of the paths becomes smaller. As the result of such arrangement and operation, the input signal applied to either of the paths *a* and *b* travels in the two paths and is successively amplified in each of the Gates of one of the paths to which the signal is applied and successively attenuated in each of the Gates of the other of the paths to which the signal is not applied. FIG. 6 shows wave forms $w_1$ and $w_2$ which respectively travel and are amplified in the two paths *a* and *b*.

(2) In the case where the resistance of each Gate is in inverse proportion to the magnitude of the control magnetic field applied from the respective Control:

In this paragraph, conditions and operations differing from the above case (1) will be described. The respective Gates are biased, by additional bias means $DC_{1a}$, $DC_{1b}$, $DC_{2a}$, $DC_{2b}$, $DC_{3a}$ and $DC_{3b}$, by an appropriate D-C magnetic bias reversely to the directions of the control magnetic fields. When the control magnetic field is applied to each Gate, the resistance of each Gate becomes smaller (or larger) according to increase (or decrease) of the magnitude of the control magnetic field. Accordingly, the resistance of the Gate (e.g., 21G) of the path *b* becomes smaller when the input signal applied to the path *a* becomes larger at one (11C) of the Controls of the path *a*. Consequently, the amplitude of the signal passing through either of the paths (*a* and *b*) becomes larger when the amplitude of the signal passing through the path other than the present path becomes larger. As the result of such conditions and operations, the input signal applied to at least one of the paths travels in boh of the two paths and is successively amplified in each of he Gates of both of the paths.

In the embodiment shown in FIG. 4, the output signal amplified as above mentioned is derived, through the output means 2*a* or 2*b*, from the path *a* or *b*. Furthermore, auxiliary means $A_1$, $A_2$, $A_3$, $A_4$, $A_5$ and $A_6$ for respectively controlling the magnitudes of the control magnetic fields may be inserted between the Gates 11G, 21G, 12G, 22G, 13G and 23G and the Controls 21C, 11C, 22C, 12C, 23C and 13C, respectively. The amplification gain is controlled by controlling the magnitude of amplification or attenuation in each of the auxiliary means $A_1$ to $A_6$.

Figure 5:
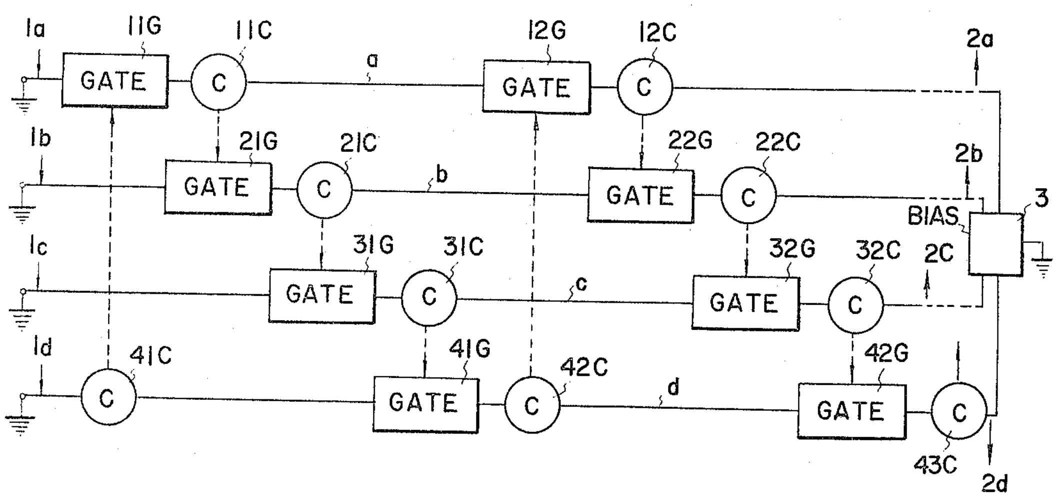

FIG. 5 shows another embodiment of this invention in which a plurality of paths *a*, *b*, *c* and *d* are arranged as shown, and respective Controls 11C, 12C, 21C, 22C, 31C, 32C, 41C, 42C and 43C interlink to respective Gates 21G, 22G, 31G, 32G, 41G, 42G, 11G and 12G etc. The Gate (e.g., 12G) of one (e.g., *a*) of the paths is controlled by the Control (e.g., 42C) of another (e.g., *d*) of the paths so as to decrease the resistance of the Gate (12G). In this case, the path *d* is controlled, through two cascade connections each composed of the Gate (e.g., 21G or 31G) and the Control (e.g., 21C or 31C), from each (e.g., 11C) of the Controls of the path *a*. In the case where the resistance of each Gate varies proportionally to the magnitude of the control magnetic field, an even number of paths may be arranged. In the case where the resistance of each Gate varies inversely in proportion to the magnitude of the control magnetic field by the use of like bias means as said means $DC_{1a}$ to $DC_{3b}$, a plurality of paths may be arranged irrespectively of restriction to odd numbers or even number of paths. Since the amplification operation of this embodiment can be easily understood by reference to the description of the operation of the embodiment shown in FIG. 4, detailed description thereof is omitted.

Figure 7:
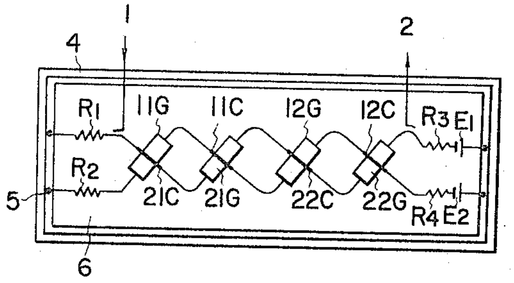
Figure 8:
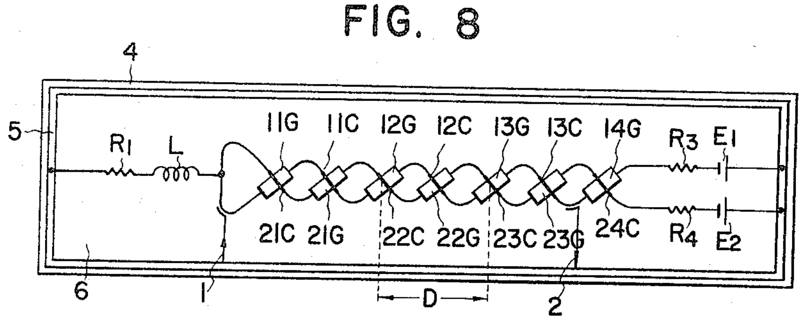
Figure 9:
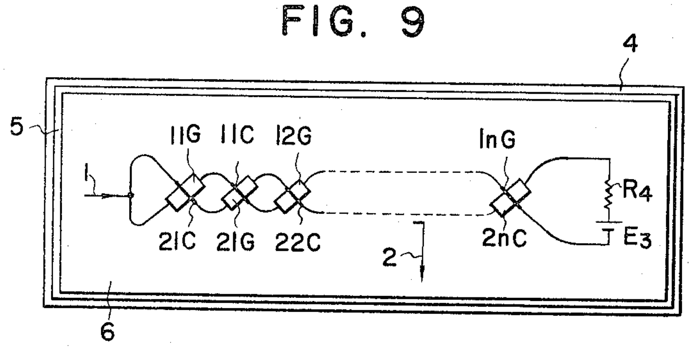

FIGS. 7, 8 and 9 show practical examples of embodiment of this invention. In these embodiments, the Gates each composed of a rectangular tin layer are arranged in parallel on the insulation layer 6, and each of the Controls intersects the corresponding Gate. In this case, each (e.g., 11C) of the Controls are connected to two (e.g., 11G and 12G) of the Gates arranged adjacently to one (e.g., 21G) of the Gates which intersects the same control means (e.g., 11C), whereby two paths are formed as shown. In FIG. 7, one end of each path is grounded through a matching resistance $R_1$ or $R_2$ to the lead layer 5, and a bias voltage source $E_1$ or $E_2$ is connected to each path through a resistor $R_3$ or $R_4$ so as to apply an appropriate bias to each path. In FIG. 8, respective ends of the two paths at one end are connected to a connection point which is grounded through a choke L. In FIG. 9, the two paths are connected in parallel to each other, and the bias voltage source $E_4$ is inserted into a loop comprising said parallelly connected two paths. In these embodiments, when a signal passed through one (e.g., 11C) of the Controls adjacent to one (e.g., 12G) of the Gates of one (1) of the paths passes through the said adjacent Gate (e.g., 12G) of the instant path (1), the Gate 12G is controlled by the Control 22C since, while the signal passed through the Control 11C travels from the Control 11C to the Gate 12G, a signal controlled by the Control 11C and passed through the Gate 21G travels from the Gate 21G to the Control 22C. Accordingly, these embodiments are operated according to the principle described with reference to FIG. 4. Said additional bias means can be arranged parallelly with each Control or through insertion of respective Gates, oppositely to the respective Controls.

Figure 10:
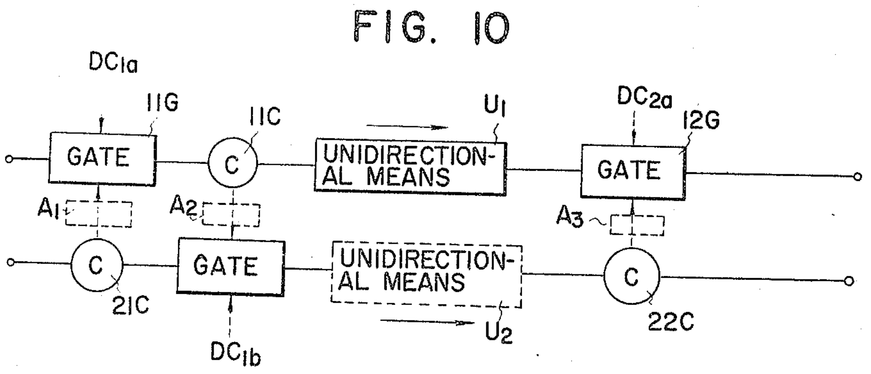

The above described embodiments of the invention relate to bidirectional amplifiers. These embodiments, however, can be easily modified to undirectional amplifiers. FIG. 10 shows an example of such unidirectional amplifier in which a unidirectional means $U_1$ (and/or $U_2$), such as a passive network utilizing the Faraday effect, is inserted into at least one of the paths. In this amplifier, the input signal aplied travels unidirectionally as indicated by arows and amplified more stably than in the bidirectional amplifiers.

Figure 11:
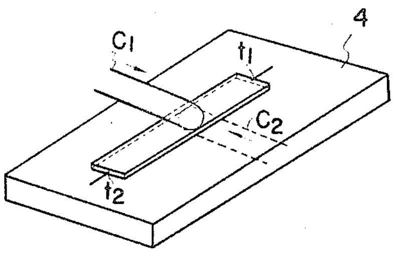

In addition to cryotrons, elements with characteristics of magneto-resistance effect can be employed as the Gates. FIG. 11 shows an example of such element which comprises a semiconductor, such as indium arsenide (InSb), indium phosphonide (InP), or gallium arsenide (GaAs) etc., with a characteristic of magneto-resistance effect. The Gate current I*g* flows in the direction of terminals $t_1$ to $t_2$. The control magnetic field is applied by a coil $C_1$ substantially perpendicular to the flow direction of the current I*g*. If necessary an additional D-C magnetic bias can be applied by a coil $C_2$ reversely to the direction of the control magnetic field, and the number of turns of the coils $C_1$ and $C_2$ may be increased to produce a sufficient magnetic field.

As described above in detail, amplifiers of this invention relates to travelling wave type amplifiers. Accordingly, the amplifiable frequency range of each of these amplifiers is extremely wide. Especially in a high frequency range in which the wave length is shorter than the pitch D (shown in FIG. 8) of the amplifier, a higher gain is obtained than in its lower frequency range. In the case where conventional cooling means is employed for cooling the amplifier of this invention, an amplifier with extremely low noise can be obtained.

Since it is obvious that many changes and modifications can be made in the above described details without departing from the nature and spirit of the invention, it is to be understood that the invention is not to be limited to the details described herein except as set forth in the appended claims.

What I claim is:

1. An amplifier, comprising a plurality of magnetoresistive mediums each having a resistance which is variable in proportion to the magnitude of a control magnetic field applied thereto, a plurality of control means each for applying the magnetic field to the medium, two paths in each of which the mediums and the control means are alternately connected in cascade, said control means of one of said paths being respectively interlinked to the mediums of the other of the paths so that the resistance of the respective medium of said one of the paths is controlled so as to vary in inverse proportion to magnitude of a signal passing through the same medium, from the control means of the other of the paths, at an instant when a signal passed through the control means adjacent to the medium of said one of the paths passes through the said adjacent medium of the instant path, bias means for applying an appropriate D-C bias to each of the paths, input means coupled with either of the paths for applying an input signal thereto, and output means coupled with the path coupling with the input means for deriving an amplified output signal therefrom, whereby the input signal travels in the path to which it is applied and is successively amplified through the respective mediums of the same path.

2. An amplifier according to claim 1, in which means for passing unidirectionally a signal applied thereto is inserted into at least one of said paths.

3. An amplifier according to claim 1, in which said mediums are arranged in parallel, each of the control means being connected to two of the mediums arranged adjacently to one of the medium which is interlinked to the same control means.

4. An amplifier according to claim 3, in which each of said mediums is composed of a super-conductor.

5. An amplifier according to claim 3, in which each of said mediums is composed of a semiconductor.

6. An amplifier according to claim 1, in which said paths are connected in parallel to each other, and the bias means is inserted to a loop comprising said parallelly connected two paths.

7. An amplifier according to claim 1, in which one end of each of said paths is connected to a connection point which is grounded through a choke, and the other ends of each of said paths are grounded respectively through the bias means.

8. An amplifier according to claim 1, in which one end of each of said paths is grounded through respectively matching impedances, and the other ends of each of said paths are grounded through bias means.

9. An amplifier, comprising a plurality of magneto-sensitive mediums each having a resistance which is variable proportionally to the magnitude of a control magnetic field applied thereto, a plurality of control means each for applying said magnetic field to the medium, two paths in each of which the mediums and the control means are alternately connected in cascade, said control means in one of said paths being respectively interlinked, in order, to the mediums in the other of the paths so that the medium adjacent to any of the control means in one of the paths is controlled by the control means adjacent to the medium, in the other of said paths, which is controlled by the said adjacent control means of said one of the paths, whereby the resistance of the respective medium of one of the paths is controlled so as to vary in inverse proportion to the magnitude of a signal passing through the same medium, from the control means of the other of the paths, at an instant when a signal passed through the control means adjacent to the medium of said one of the paths passes through the said adjacent medium of the same path, bias means for applying an appropriate D-C bias to each of the paths, input means coupled with any of the paths for applying an input signal thereto, and output means coupled with the path coupling with the input means for deriving an amplified output signal therefrom, whereby the input signal travels in the path to which it is applied and is successively amplified through the respective mediums of the same path.

10. An amplifier according to claim 9, in which means for passing unidirectionally a signal applied thereto is inserted into at least one of said paths.

11. An amplifier, comprising a plurality of magneto-resistive mediums each having a resistance which is variable in proportion to the magnitude of a control magnetic field applied thereto, a plurality of control means each for applying the magnetic field to the medium, two paths in each of which the mediums and the control means are alternately connected in cascade, said control means of one of said paths being respectively interlinked to the mediums of the other of the paths so that the resistance of the respective medium of said one of the paths is controlled so as to vary in inverse proportion to the magitude of a signal passing through the same medium, from the control means of the other of the paths, through an auxiliary means for controlling the magnitude of the control magnetic field, at an instant when a signal passed through the control means adjacent to the medium of said one of the paths passes through the said adjacent medium of the same path, bias means for applying an appropriate D-C bias to each of the paths, input means coupled with any of the paths for applying an input signal thereto, and output means coupled with the path coupling with the input means for deriving an amplified output signal therefrom, whereby the input signal travels in the path to which it is applied and is successively amplified through the respective mediums of the same path.

12. An amplifier according to claim 11, in which means for passing unidirectionally a signal applied thereto is inserted into at least one of said paths.

13. An amplifier, comprising a plurality of magneto-resistive mediums each having a resistance which is variable in proportion to the magnitude of control magnetic field applied thereto, a plurality of control means each for applying the magnetic field to the medium, a plurality of paths in each of which the mediums and the control means are alternately connected in cascade, said control means of one of said paths being respectively interlinked to the mediums of another of the paths so that the resistance of the respective medium of said one of the paths is controlled so as to vary in inverse proportion to the magnitude of a signal passing through the same medium, from the control means of the path controlled by the same control means, through at least one cascade connection composed of the medium and the control means each belonging to a path different from said one and another paths, at an instant when a signal passed through the control means adjacent to the medium of said one of the paths passes through the said adjacent medium of the same path, bias means for applying an appropriate D-C bias to each of the paths, input means coupled with any of the paths for applying an input signal thereto, and output means coupled with the path coupling with the input means for deriving an amplified output signal therefrom, whereby the input signal travels in the path to which it is applied and is successively amplified through the respective mediums of the same path.

14. An amplifier according to claim 13, in which means for passing unidirectionally a signal applied thereto is inserted into at least one of said paths.

15. An amplifier, comprising a plurality of magneto-resistive mediums each having a resistance which is variable in proportion to the magnitude of a control magnetic field applied thereto, a plurality of control means each for applying the magnetic field to the medium, a plurality of paths in each of which the mediums and the control means are alternately connected in cascade, said control means of one of said paths being respectively interlinked to the medium of another of the paths through auxiliary means for controlling the magnitude of the control magnetic field, so that the resistance of the respective medium of said one of the paths is controlled so as to vary in inverse proportion to the magnitude of a signal passing through the same medium, from the control means of the path controlled by the same control means, through said auxiliary means and at least one cascade connection composed of the medium and the control means each belonging to the path different from said one and another paths, at an instant when a signal passed through the control means adjacent to the medium of said one of the paths passes through the said adjacent medium of the same path, bias means for applying an appropriate D-C bias to each of the paths, input means coupled with any of the paths for applying an input signal thereto, and output means coupled with the path coupling with the input means for deriving an amplified output signal therefrom, whereby the input signal travels in the path to which it is applied and is successively amplified through the respective mediums of the same path.

16. An amplifier according to claim 15, in which means for passing unidirectionally a signal applied thereto is inserted into at least one of said paths.

17. An amplifier, comprising a plurality of magneto-resistive mediums each having a resistance which is variable proportionally to the magnitude of a control magnetic field applied thereto and each biased to an appropriate D-C magnetic bias in the reverse direction of the control magnetic field, a plurality of control means each for applying the magnetic field to the medium, two paths in each of which the mediums and the control means are alternately connected in cascade, said control means of one of said paths being respectively interlinked to the other of the paths so that the resistance of the respective medium of said one of the paths is controlled so as to vary in proportion to the magnitude of a signal passing through the same medium, from the control means of the other path, through an auxiliary means for controlling the magnitude of the control magnetic field, at an instant when a signal passed through the control means adjacent to the medium of said one of the paths passes through the said adjacent medium of the same, path bias means for applying an appropriate D-C bias to each of the paths, input means coupled with any of the paths for applying an input signal thereto, and output means coupled with the path coupling with the input means for deriving an amplified output signal therefrom, whereby the input signal travels in the path to which it is applied and is successively amplified through the respective mediums of the same path.

18. An amplifier according to claim 17, in which means for passing unidirectionally a signal applied thereto is inserted into at least one of said paths.

19. An amplifier, comprising a plurality of magneto-resistive mediums each having a resistance which is variable proportionally to the magnitude of a control magnetic field applied thereto and each biased to an appropriate magnetic bias in the reverse direction of the control magnetic field, a plurality of control means each for applying the magnetic field to the medium, a plurality of paths in each of which the mediums and the control means are alternately connected in cascade, said control means of one of said paths being respectively interlinked to another of the paths so that the resistance of the respective medium of said one of the paths is controlled so as to vary in proportion to the magnitude of a signal passing through the same medium, from the control means of another of the path controlled by the same control means, through at least one cascade connection composed of the medium and the control means each belonging to the path different from said one and another paths, at an instant when a signal passed through the control means adjacent to the medium of said one of the paths passes through the said adjacent medium of the same path, bias means for applying an appropriate D-C bias to each of the paths, input means coupled with any of the paths for applying an input signal thereto, and output means coupled with the path coupling with the input means for deriving an amplified output signal therefrom, whereby the input signal travels in the path to which it is applied and is successively amplified through the respective mediums of the same path.

20. An amplifier according to claim 19, in which means for passing unidirectionally a signal applied thereto is inserted into at least one of said paths.

21. An amplifier according to claim 19, in which each of the control means of each path controls, through an auxiliary means for controlling the magnitude of the control magnetic field, the corresponding medium of another path.

22. An amplifier, comprising a plurality of magneto-resistive mediums each having a resistance which is variable proportionally to the magnitude of a control magnetic field applied thereto, a plurality of control means each for applying said magnetic field to the medium, an even number of paths in each of which the mediums and the control means are alternately connected in cascade, said control means of one of said paths being respectively interlinked of another of the paths so that the resistance of the respective medium of said one of the paths is controlled so as to vary in inverse proportion to the magnitude of a signal passing through the same medium, from the control means of another of the path controlled by the same control means through at least one cascade connection composed of the medium and the control means each belonging to the path different from said one and another paths, at an instant when a signal passed through the control means adjacent to the medium of said one of the paths passes through the said adjacent medium of the same path, bias means for applying an appropriate D-C bias to each of the paths, input means coupled with any of the paths for applying an input signal thereto, and output means coupled with the path coupling with the input means for deriving an amplified output signal therefrom, whereby the input signal travels in the path to which it is applied and is successively amplified through the respective mediums of the same path.

23. An amplifier according to claim 22, in which means for passing unidirectionally a signal applied thereto is inserted into at least one of said paths.

24. An amplifier according to claim 22, in which each of the control means of each path controls, through an auxiliary means for controlling the magnitude of the control magnetic field, the corresponding medium of another path.

References Cited

UNITED STATES PATENTS

| | | | |
|---|---|---|---|
| 3,059,196 | 10/1962 | Lentz | 338—32 |
| 3,088,040 | 4/1963 | Newhouse | 307—245 |
| 3,234,439 | 2/1966 | Alphonse | 317—234 |

ROY LAKE, *Primary Examiner.*

NATHAN KAUFMAN, *Examiner.*